US011574874B2

(12) United States Patent
May et al.

(10) Patent No.: US 11,574,874 B2
(45) Date of Patent: Feb. 7, 2023

(54) PACKAGE ARCHITECTURE UTILIZING PHOTOIMAGEABLE DIELECTRIC (PID) FOR REDUCED BUMP PITCH

(71) Applicant: INTEL CORPORATION, Santa Clara, CA (US)

(72) Inventors: Robert A. May, Chandler, AZ (US); Sri Ranga Sai Boyapati, Chandler, AZ (US); Kristof Darmawikarta, Chandler, AZ (US); Hiroki Tanaka, Chandler, AZ (US); Srinivas V. Pietambaram, Gilbert, AZ (US); Frank Truong, Gilbert, AZ (US); Praneeth Akkinepally, Chandler, AZ (US); Andrew J. Brown, Chandler, AZ (US); Lauren A. Link, Chandler, AZ (US); Prithwish Chatterjee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 571 days.

(21) Appl. No.: 16/473,598

(22) PCT Filed: Mar. 30, 2017

(86) PCT No.: PCT/US2017/024995
§ 371 (c)(1),
(2) Date: Jun. 25, 2019

(87) PCT Pub. No.: WO2018/182610
PCT Pub. Date: Oct. 4, 2018

(65) Prior Publication Data
US 2021/0134727 A1    May 6, 2021

(51) Int. Cl.
*H01L 23/538* (2006.01)
*H01L 21/48* (2006.01)

(52) U.S. Cl.
CPC ...... *H01L 23/5386* (2013.01); *H01L 21/4857* (2013.01); *H01L 23/5381* (2013.01)

(58) Field of Classification Search
CPC ......... H01L 23/5386; H01L 2224/2201; H01L 2224/2205; H01L 2924/15153–15157;
(Continued)

(56) References Cited

U.S. PATENT DOCUMENTS 5,758,413 A * 6/1998 Chong ................ H01L 23/5384
148/26
7,126,164 B2   10/2006 Johnson et al.
(Continued)

FOREIGN PATENT DOCUMENTS

KR    2006-0093725    8/2006

OTHER PUBLICATIONS

International Search Report and Written Opinion for International Patent Application No. PCT/US17/24995, dated Dec. 28, 2017.
(Continued)

*Primary Examiner* — Amar Movva
(74) *Attorney, Agent, or Firm* — Essential Patents Group, LLP.

(57) ABSTRACT

An apparatus system is provided which comprises: a photoimageable dielectric layer; a first interconnect structure formed through the photoimageable dielectric, the first interconnect structure formed at least in part using a lithography process; and a second interconnect structure formed through the photoimageable dielectric, the second interconnect structure formed at least in part using a laser drilling process.

20 Claims, 10 Drawing Sheets

(58) Field of Classification Search
CPC ............... H01L 23/481; H01L 23/5226; H01L 2225/06548
See application file for complete search history.

(56) References Cited

U.S. PATENT DOCUMENTS

| | | | |
|---|---|---|---|
| 9,401,350 B1* | 7/2016 | We | ........................ H01L 24/19 |
| 2012/0261838 A1 | 10/2012 | Braunisch et al. | |
| 2016/0056102 A1* | 2/2016 | Konchady | ........... H01L 23/5383 174/263 |
| 2016/0141234 A1 | 5/2016 | We et al. | |

OTHER PUBLICATIONS

International Preliminary Report on Patentability for International Application No. PCT/US2017/024995 dated Oct. 10, 2019.

* cited by examiner

PACKAGE ARCHITECTURE UTILIZING PHOTOIMAGEABLE DIELECTRIC (PID) FOR REDUCED BUMP PITCH

CLAIM OF PRIORITY

This Application is a National Stage Entry of, and claims priority to, PCT Application No. PCT/US17/24995, filed on Mar. 30, 2017 and titled "PACKAGE ARCHITECTURE UTILIZING PHOTOIMAGEABLE DIELECTRIC (PID) FOR REDUCED BUMP PITCH," which is incorporated by reference in its entirety for all purposes.

BACKGROUND

Conventionally, lasers are often used to drill holes or vias in a substrate or a dielectric layer, e.g., to form interconnects between different layers. For example, in a multi-die interconnect bridge structure, laser drilling may be used to form connections between a die or a component and a surrounding substrate. In some examples, accuracy in the laser drilling process may limit a bump pitch formed using such laser drilling. For example, with improvements in laser drilling, the bump pitch can be driven to the range of about 30-60 micrometer (μm). However, it may be difficult to further limit the bump pitch using laser drilling.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
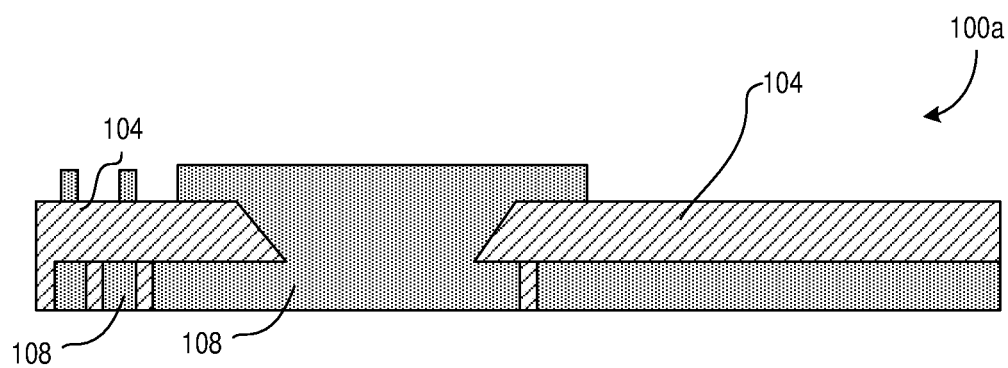
FIGS. 1A-1M schematically illustrate operations associated with a process to form a first interconnect structure using photoimageable dielectric (PID) and lithography, and a second interconnect structure using laser drilling, according to some embodiments.

An interconnect structure (e.g., a bump) formed using laser drilling may have relatively larger width. For example, even with improvements in laser drilling, an opening in a dielectric layer to form an interconnect structure using laser drilling can be driven to the range of about 30-60 μm.

In some embodiments, to reduce a pitch of such interconnect structures, photolithography techniques may be used. For example, a photoimageable dielectric (PID) material may be used (e.g., instead of conventional dielectric material) to cover a bump pad. In some embodiments, the PID material may be patterned using high resolution lithography. Patterning the PID material using high resolution lithography may form an opening that may be as small as about 10 μm, or even about 5 μm (e.g., in a range of about 3-20 μm). In some embodiments, the same PID layer may also be used to cover sections of a conductive layer on which laser drilled interconnect structures are to be formed. Laser drilling may be performed to form larger interconnect structures, e.g., in the range of about 30-60 μm.

In some embodiments, the relatively large laser drilled interconnect structures may be used for power plane signals, ground plane signals, or in situations where a pitch of the interconnect structures is not very critical. In contrast, lithographically formed interconnect structures using PID material may be used for other types of signals, and/or may be used where reducing a pitch of such interconnect structures is desirable.

Forming laser drilled interconnect structures and lithographically formed interconnect structures in close proximity can have various challenges. For example, the laser drilling may be performed subsequent to forming the PID layer and subsequent to forming a small via in the PID layer for the lithographically formed interconnect structure. In an example, the laser drilling can generate residues or debris that may have to be cleaned, e.g., before forming a laser drilled interconnect structure. In some embodiments, a desmear operation may be performed to clean the residue generated by laser drilling. However, in some embodiments, the desmear operation may also at least partially etch the PID layer and the via in the PID layer. To prevent any etch of the PID layer during the desmear operation, in some embodiments, a protective layer may be formed on the PID layer and the via in the PID layer. The protective layer may be selected based on a type of desmear operation to be performed. Subsequent to the desmear operation, the protective layer may be etched. Thus, the protective layer may protect the PID layer and the via for the lithographically formed interconnect structure during the desmear operation.

In some embodiments, at least some of the lithographically formed interconnect structures may be formed on bump pads of a bridge die. In some embodiments, at least some of the laser drilled interconnect structures may be formed on a conductive layer adjacent to the bridge die. In some embodiments, there may be a trench or cavity between the bridge die and a dielectric layer (e.g., where the conductive layer may be embedded within the dielectric layer). In some embodiments, while forming the interconnect structures, it may be desirable to fil the trench or cavity by an appropriate dielectric material. For example, first dielectric material may be formed within the trench or cavity, and second dielectric material may be formed on top of the bridge die and the dielectric layer. Subsequently, the second dielectric material may be etched from the top of the bridge die and the dielectric layer. In some embodiments, the dielectric materials may be chosen such that the first dielectric material used for filing the trench or cavity may have relatively high filler density, may include large filler materials, may have low etch rate, and/or may be difficult to be removed, e.g., compared to the second dielectric material. In some embodiments, selecting the materials in such a manner may, for example, may result in the first dielectric material acting as an etch stop layer while the second dielectric layer is being etched away. Accordingly, the first dielectric material within the trench or cavity may not be etched, and the trench or cavity may remain substantially filled.

Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Figure 1B:
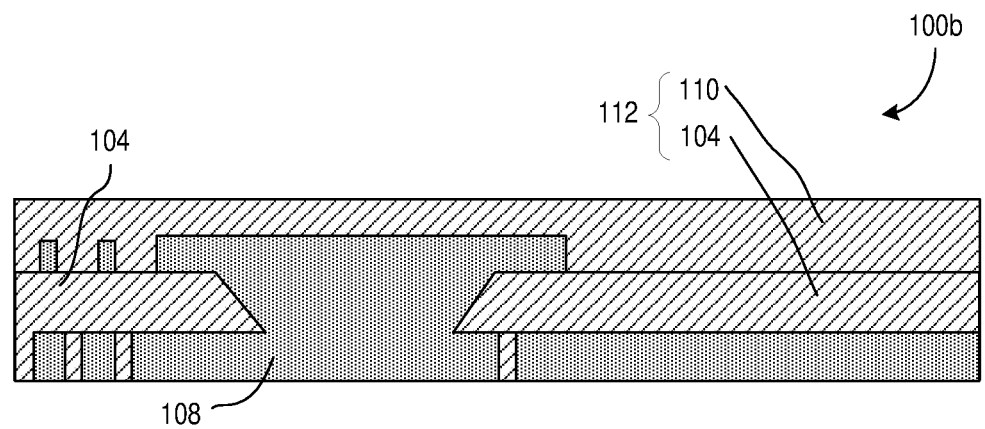
Figure 1C:
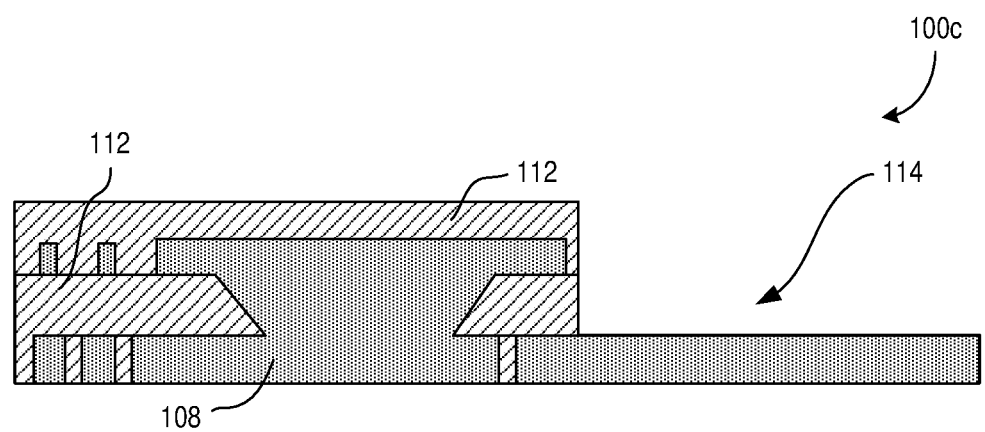
Figure 1D:
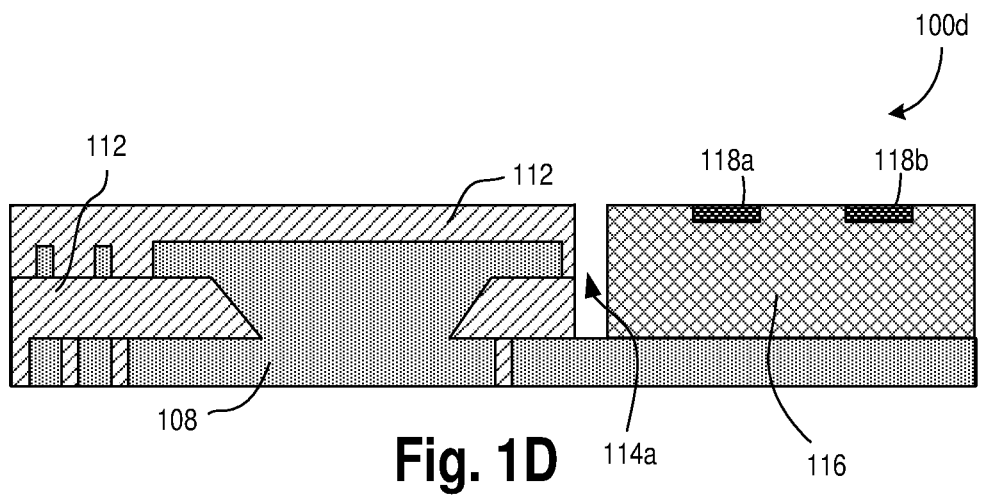
Figure 1E:
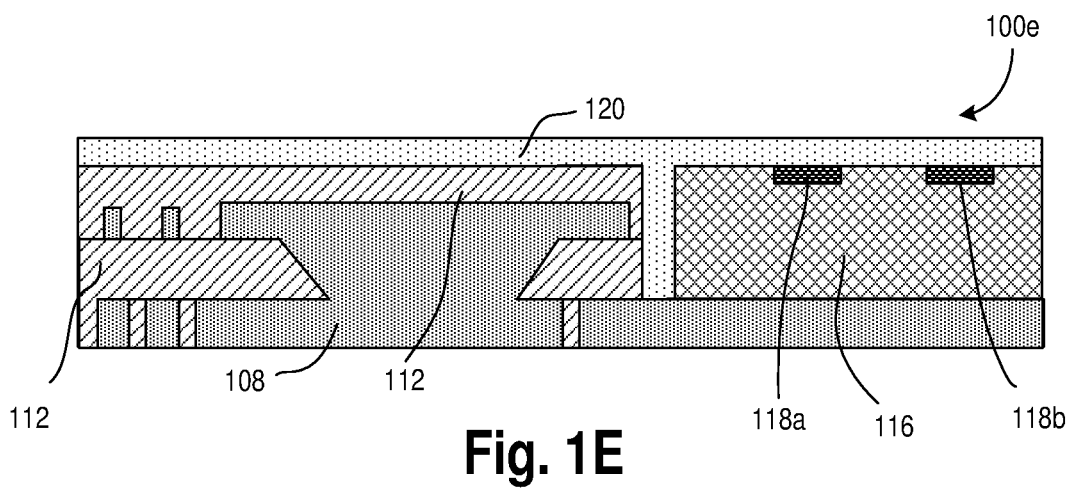
Figure 1F:
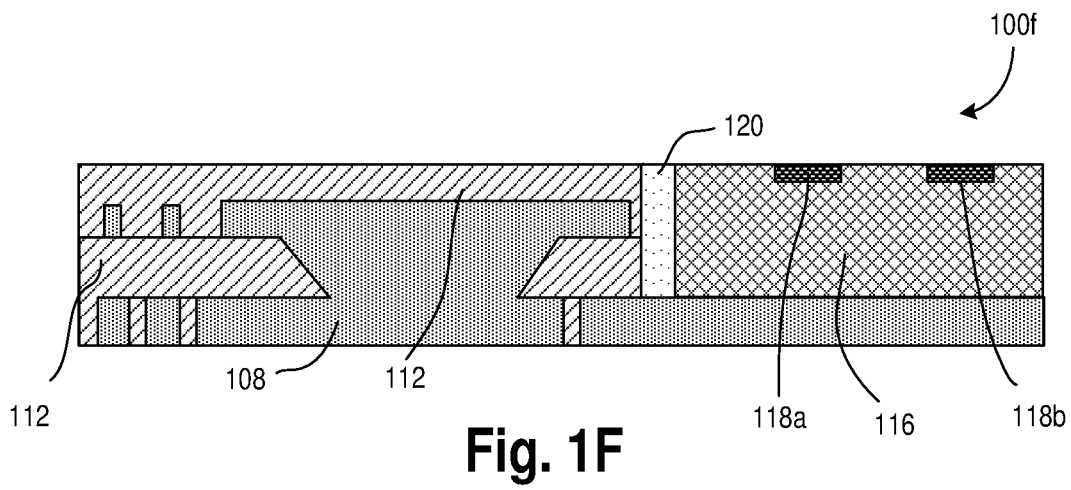
Figure 1G:
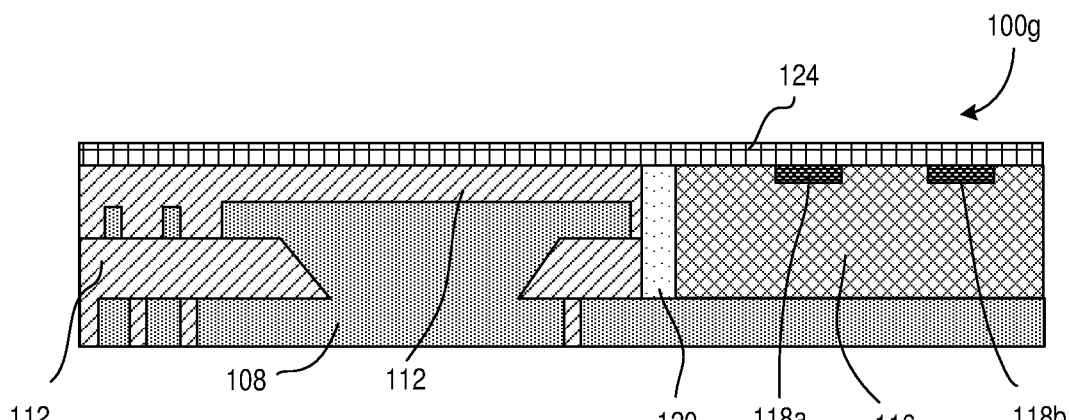
Figure 1H:
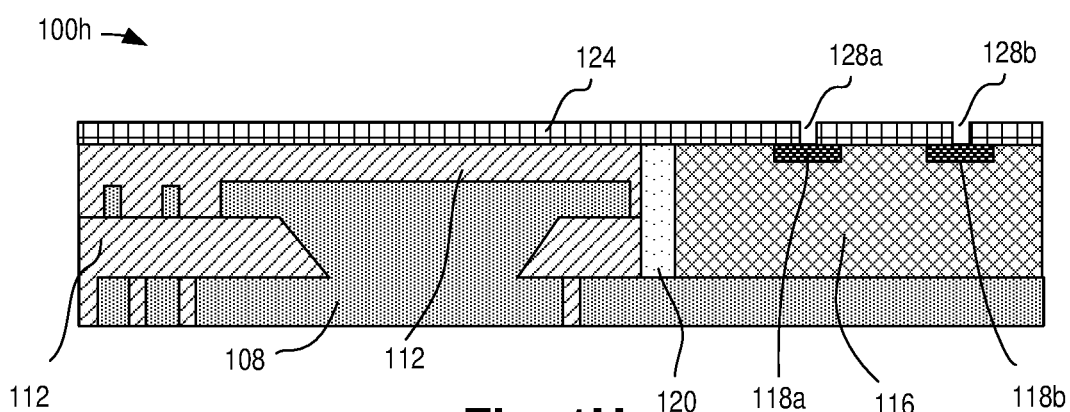
Figure 1I:
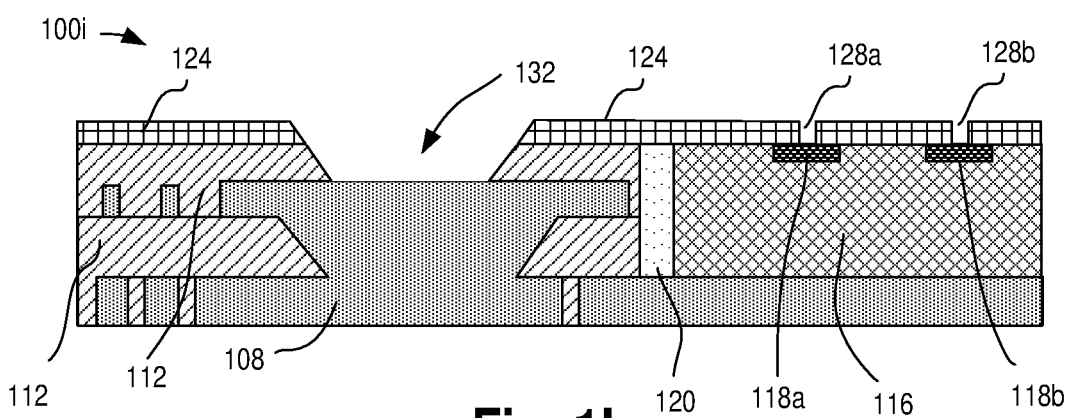
Figure 1J:
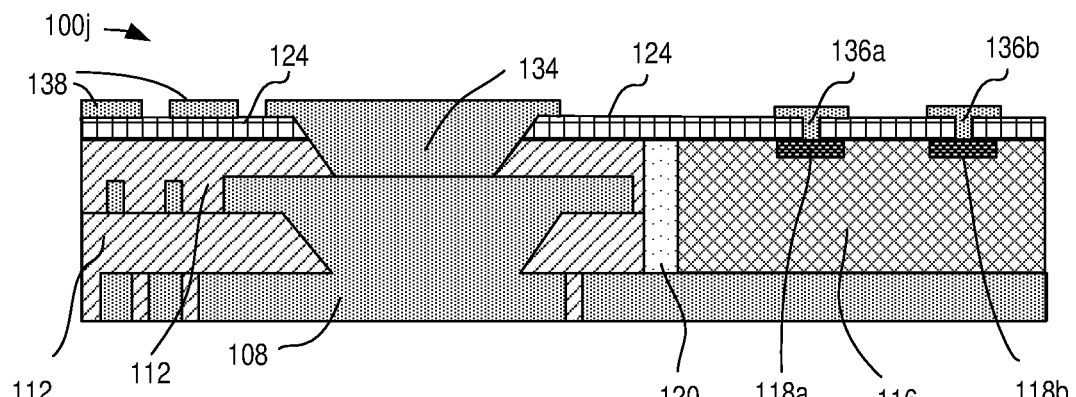
Figure 1K:
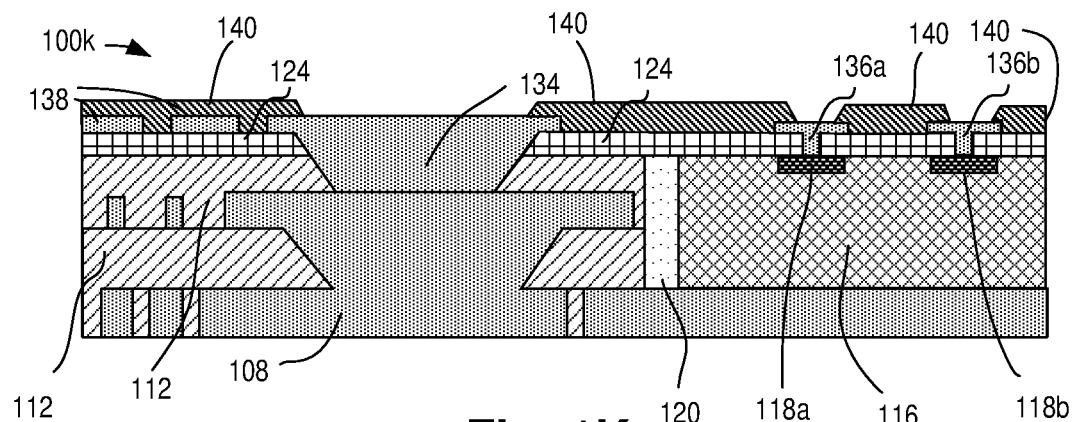
Figure 1L:
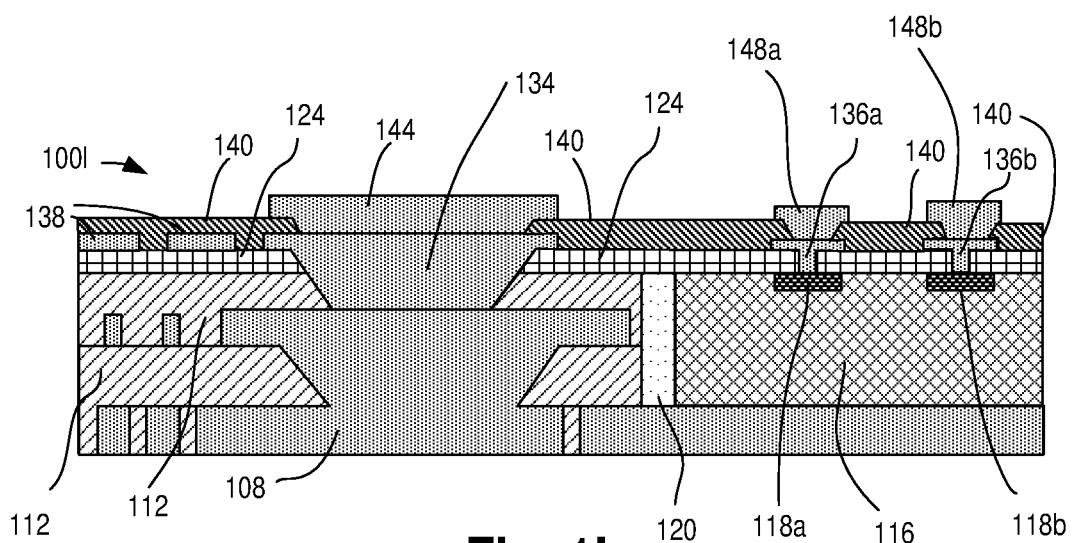
Figure 1M:
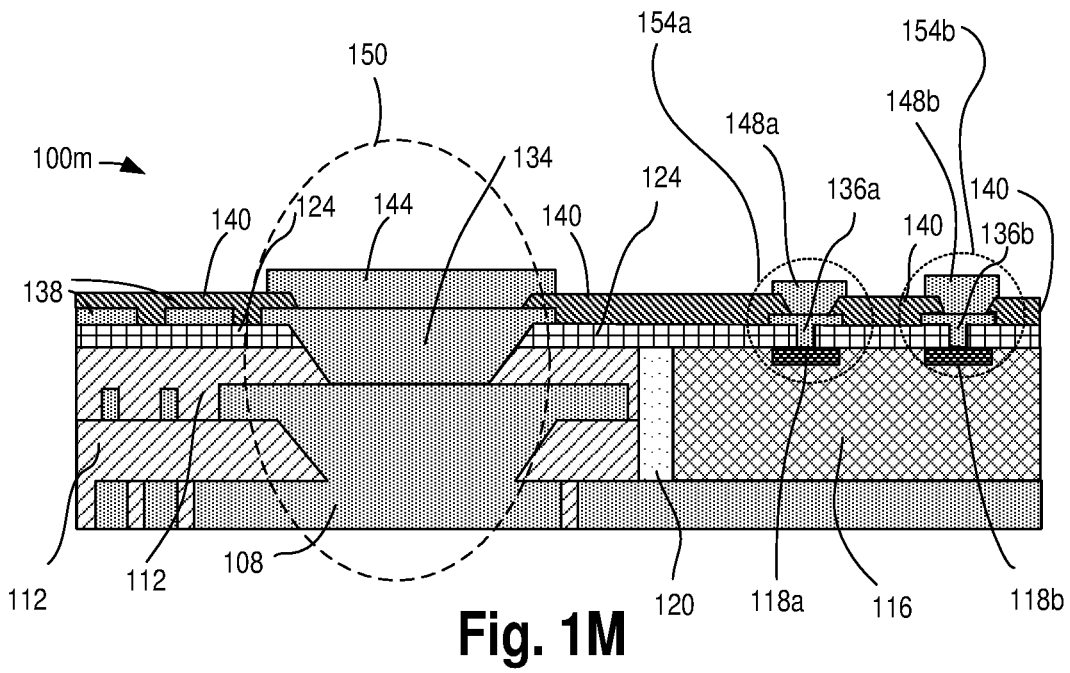
Figure 1N:
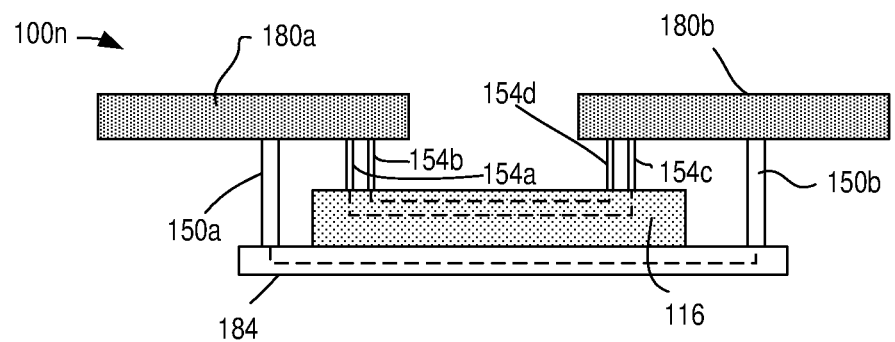
FIG. 1N illustrates a semiconductor package where the components of FIG. 1A-1M may be used, according to some embodiments.

FIGS. 1A-1N schematically illustrate operations associated with a process to form a first interconnect structure using photoimageable dielectric (PID) and lithography, and a second interconnect structure using laser drilling, according to some embodiments. Referring to FIG. 1A, illustrated is a component 100a. In some embodiments, the component 100a may comprise a dielectric layer 104 and a conductive layer 108. The dielectric layer 104 may comprise any appropriate dielectric material, and for example, need not be photoimageable dielectric material. The conductive layer 108 may comprise an appropriate conductive material, such as copper, aluminum, etc. The conductive layer 108 may be disposed at least in part through an opening in the dielectric layer 104. The component 100a may be formed using any appropriate operations, e.g., using at least in part a semi-additive process (SAP). Although the component 100a may be formed on a substrate, an active die, an active or passive component, and/or any other appropriate elements, such elements are not illustrated in FIG. 1A for purposes of illustrative clarity and in order to not obfuscate the teachings of this disclosure.

Referring now to FIG. 1B, a component 100b may be formed by depositing, laminating and/or forming a laminate protection film, a protection film, an insulating layer and/or a dielectric layer, referred to as layer 110, over the dielectric layer 104 and the conductive layer 108. In some embodiments, the layer 110 may protect the conductive layer 108, for example, when a trench or cavity is formed in the component 100b, where the formation of such a trench or cavity is discussed herein with respect to FIG. 1C.

Continuing to refer to FIG. 1B, in some embodiments, the layer 110 and the dielectric layer 104 may comprise of similar material, although in some other embodiments, these two layers may comprise different material. For the purposes of this disclosure, the layers 110 and 104 are, in combination, referred to as dielectric layer 112, or simply as layer 112. For example, the layers 110 and 104 are henceforth illustrated using same type of shading. As discussed herein above, the layer 112 may not necessarily comprise photoimageable dielectric material dielectric material (although in some embodiments, the layer 112 may comprise photoimageable dielectric material).

Referring now to FIG. 1C, a component 100c may be formed by forming a trench or cavity 114 in the component 100b. The trench or cavity 114 may be a cavity, a trench and/or an opening in the component 100c. The trench or cavity 114 may be formed by selectively removing sections of the layer 112. The removal of the layer 112 may be achieved by any appropriate process, e.g., by etching, by chemical and/or mechanical polishing, using drilling (e.g., mechanical and/or laser drilling) and subsequent cleaning, and/or any other appropriate process for forming such a trench or cavity.

Referring now to FIG. 1D, a component 100d may be formed by placing a component 116 within the trench or cavity 114. For example, the component 116 may at least partially fill the trench or cavity 114. In some embodiments, a portion of the trench or cavity 114 may not be covered by the component 116, where the portion of the trench or cavity 114 not be covered by the component 116 is referred to as a trench or cavity 114a. Thus, the trench or cavity 114a may between the component 116 and the layer 112.

The component 116 may be any appropriate component. In some embodiments, the component 116 may be a semiconductor die comprising passive and/or active components (e.g., such as transistors, etc.).

In some other embodiments, the component 116 may be a bridge die or an interposer comprising passive components, but no active components. In such embodiments, the component 116 may be used to interconnect between, for example, two active dies (where the two active dies comprise respective active components such as transistors, logic, etc., and where the active two dies are not illustrated in the figures). In such embodiments, the component 116 may comprise traces, interconnection layers, redistribution layers, routing structures, etc. used for connecting the two dies.

In some embodiments, the component 116 may comprise bump pads 118a and 118b. Although the component 116 is likely to include a plurality of such bump pads, merely two are illustrated in FIG. 1D for purposes of illustrative clarity.

Referring now to FIG. 1E, a component 100e may be formed by laminating, depositing or otherwise forming a layer 120 on the component 100d. The layer 120 may comprise dielectric material. In some embodiments, the layer 120 may comprise multiple grades or types of dielectric material, e.g., as also discussed with respect to FIGS. 3A-3C. In some embodiments, the layer 120 may fill the trench or cavity 114a, and may be deposited on a top surface of the component 100e.

Referring now to FIG. 1F, a component 100f may be formed by selectively etching the layer 120. In an example, the layer 120 may be etched so that top surfaces of the layer 112 and the component 116 are exposed. For example, the layer 112 and the component 116 may act as etch stop layer. In some embodiments, the portion of the layer 120 within the trench or cavity 114a may also act as etch stop layer and not get etched, e.g., as also discussed with respect to FIGS. 3A-3C.

In some examples and although not illustrated in the figures, although a top section of the layer 120 within the trench or cavity 114a may also be partially etched (e.g., due to partial over-etching), material deposition illustrated in subsequent figures (e.g., deposition of PID layer 124 in FIG. 1G) can fill such a void.

Referring now to FIG. 1G, a component 100g may be formed by forming a PID layer 124 over the component 100f. The PID layer may comprise PID material. Any appropriate type of PID material may be used. In some embodiments, the PID material may act as a dielectric layer, and may be photoimageable (e.g., etched through exposure to appropriate type of light).

In some embodiments, to form the PID layer 124, PID material may be deposited on top of the component 100f, and may then be planarized by, for example, a stainless-steel press, thereby resulting in a uniform or about uniform thickness of the PID layer 124. In some embodiments, the PID layer 124 may be laminated on the component 100g using an appropriate lamination process. Any other appropriate process may also be used to form the PID layer 124.

Referring now to FIG. 1H, a component 100h may be formed by selectively patterning the PID layer 124. In some embodiments, the PID layer 124 is patterned to, for example, form openings above the bump pads 118a/b of the component 116. For example, an opening 128a in the PID layer 124 is formed over the bump pad 118a, and an opening 128b in the PID layer 124 is formed over the bump pad 118b.

In some embodiments, the openings 128a and 128b (henceforth referred to as "opening 128" in singular, and openings 128 in plural) may be formed by an appropriate photolithography process (e.g., using a high-resolution photolithography process). Merely as an example and although not illustrated in the figures, a mask may be disposed on top of the PID layer 124, where the mask may have openings corresponding to the openings 128. Subsequently, an appropriate type of light may be exposed through the openings in the mask to form the openings 128. The mask then may be removed or etched using an appropriate means. Any other appropriate operations associated with such a photolithography process may also be performed.

Referring now to FIG. 1I, an opening 132 may be formed in the PID layer 124 and the layer 112, to form a component 100i. In some embodiments, the opening 132 may expose the conductive layer 108. In some embodiments, the opening 132 may be formed outside of the region where the component 116 resides.

Figure 2A:
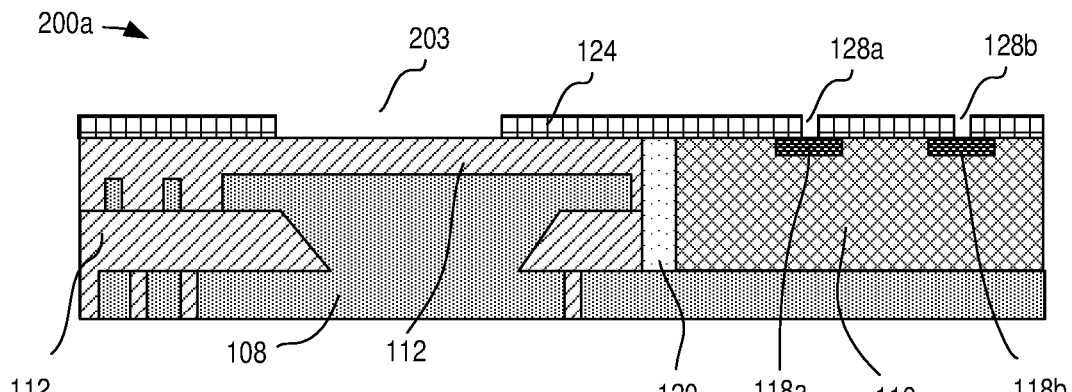
FIGS. 2A-2E illustrate a desmear process in which PID material of a PID layer is protected from being etched away, according to some embodiments.

In some embodiments, the opening 132 may be formed by laser drilling. In some embodiments, the laser drilling may be followed by a desmear process (e.g., a permanganate based desmear process) that may clean up the opening 132. In some embodiments, additional operations to protect the PID layer 124 from the desmear process may be performed. FIGS. 2A-2—discusses examples of such additional operations for protecting the PID layer 124 during the desmear process.

Referring now to FIG. 1J, a component 100j may be formed by depositing conductive layers 134, 136a, and 136b in the openings 132, 128a, and 128b, respectively. In some embodiments, conductive layers 138 may also be formed on the surface of the component 100j. The conductive layers 134, 136a, 136b, and/or 138 may comprise copper, although in other embodiments, these layers may comprise another appropriate conductive material (e.g., aluminum, or another appropriate metal). The conductive layers 134, 136a, 136b, and/or 138 may be formed, for example, by depositing copper seed over the surface of the component 100i, lithographically patterning the copper seed over the openings 132, 128a, and/or 128b (and over the areas where the layer 138 is to be formed), and/or electrodepositing copper into the pattern to form the conductive layers 134, 136a, 136b, and/or 138. Any other appropriate semi-additive process or other process may also be used to form these conductive layers.

Referring now to FIG. 1K, illustrated is a component 100k that may be formed by forming solder resist layers 140 at appropriate sections of the component 100j. The solder resist layers 140 may be formed such that the solder resist layers 140 has openings over the conductive layers 134, 136a, and 136b. The solder resist layers 140 may comprises any appropriate solder resist material.

Referring now to FIG. 1L, illustrated is a component 100l that may be formed by forming conductive layers 144, 148a, and 148b through the openings in the solder resist layers 140. For example, the conductive layers 144, 148a, and 148b may be formed respectively over the conductive layers 134, 136a, and 136b. In some embodiments, the conductive layers 144, 148a, and 148b may be similar to the conductive layers 134, 136a, and 136b (e.g., may comprise copper, or other appropriate metal), and may be formed in a similar manner.

Referring now to FIG. 1M, illustrated is a component 100m that may be similar to the component 100l of FIG. 1L. In FIG. 1M, three interconnect structures 150, 154a, and 154b are specifically labeled using dotted circles. For example, the interconnect structure 150 may comprise a combination of the conductive layers 108, 134, and 144. The interconnect structure 154a may be formed on the bump pad 118a of the component 116, and may be comprise a combination of the conductive layers 136a and 148a. Similarly, the interconnect structure 154b may be formed on the bump pad 118b of the component 116, and may be comprise a combination of the conductive layers 136b and 148b. The interconnect structures 150, 154a, 154b may be bumps used for interconnection.

As discussed herein, the interconnect structure 150 may be formed based on laser drilling the opening 132 (e.g., in FIG. 1I). In contrast, the interconnect structures 154a and 154*b* may be formed by lithographically patterning the PID layer 124 to for the openings 128*a* and 128*b*, respectively. Accordingly, in some examples, the interconnect structure 150 may also referred to as a laser drilled interconnect structure, and the interconnect structures 154*a* and 154*b* may also be referred to as PID based interconnect structures, lithographically formed interconnect structures, and/or the like.

In some embodiments, a width of the opening 132 (e.g., diameter of the opening, e.g., assuming that the opening is circular or near circular in shape) in FIG. 1I associated with the interconnect structure 150 may be in the range of about 30-60 µm, or at least higher than about 30 µm. Accordingly, a pitch of the laser drilled interconnect structures may be relatively large. In contrast, in some embodiments, width of the openings 128*a* and 128*b* (e.g., diameters of the openings, e.g., assuming that the openings are circular or near circular in shape) in FIG. 1H (e.g., which may be formed by high resolution photolithography) associated with the interconnect structures 154*a* and 154*b* can be about 10 µm, or even as small as about 5 µm (e.g., in the range of about 3-20 µm). Such a precision opening may not be formed using laser drilling. Accordingly, a pitch of the lithographically formed interconnect structures may be relatively small (e.g., much smaller than the pitch of laser drilled interconnect structures).

While the lithographically formed interconnect structures may have smaller pitch, in some applications, laser drilled interconnect structures may be desirable. For example, the relatively large interconnect structures may be used for transmitting power signals, ground signals, or other high current signals. Accordingly, the relatively large laser drilled interconnect structures may be used for certain types of signals, while the smaller sized lithographically formed interconnect structures may be used for some other types of signals.

FIG. 1N illustrates a semiconductor package 100*n* where the components of FIG. 1A-1M may be used, according to some embodiments. The component 100*n* may comprise active dies 180*a* and 180*b*. The component 116 of FIGS. 1A-1M may interconnect the two dies 180*a* and 180*b*. For example, the component 116 may be formed over another component 184, which may be, for example, a substrate, a conductive layer, etc. The component 116 may be electrically connected to the die 180*a* though the interconnect structures 154*a* and 154*b* (e.g., as discussed with respect to FIG. 1M). Also, the component 116 may be electrically connected to the die 180*b* via interconnect structures 154*c* and 154*d*. The interconnect structures 154*a* and 154*c* may be connected through routing traces (e.g., illustrated using dotted lines) within the component 116, and the interconnect structures 154*b* and 154*d* may be connected through routing traces (e.g., illustrated using dotted lines) within the component 116, thereby connecting the dies 180*a* and 180*b*. The dies 180*a* and 180*b* may also be connected via interconnect structures 150*a* and 150*b* formed on the component 184 (e.g., via routing traces within the component 184, illustrated using dotted lines). As discussed, at least some of the interconnect structures 150*a* or 150*b* may be formed by laser drilling, and at least some of the interconnect structures 154*a*, 154*b*, 154*c*, or 154*d* may be formed lithographically. In the example of FIG. 1N, the component 116 may be a bridge die that bridges the two active dies 180*a* and 180*b*. The connection between the two dies 180*a* and 180*b* may be referred to as Embedded Multi-die Interconnect Bridge (EMIB). FIG. 1N illustrates a basic and simple implementation of an EMIB, and an EMIB may have several other components, dies, interconnect structures, traces, bridge dies, routing traces, etc. that are not illustrated for sake of illustrative clarity and to not obfuscate the teachings of this disclosure.

Referring again to FIG. 1I, after the opening 132 is formed in the PID layer 124 and the layer 112 using laser drilling, the laser drilling may be followed by a desmear process that may clean up the opening 132 from any residue from the laser drilling. In some example, the desmear process may use a permanganate bath to oxidize the organic components and remove such components from a bottom section of the opening. Such a desmear process may, depending on the PID material chosen for the PID layer 124, etch away some of the PID material. Accordingly, in some embodiments, it may be desirable to protect the PID material of the PID layer 124 from the desmear chemistry.

FIGS. 2A-2E illustrate a desmear process in which PID material of the PID layer 124 is protected from being etched away, according to some embodiments. Referring to FIG. 2A, illustrated is a component 200*a*, which may be formed from the component 100*h* of FIG. 1H. For example, the PID layer 124 of the component 100*h* may be patterned to form an opening 203 in the component 200*a*. In some embodiments, the opening 203 may be formed, for example, while forming the openings 128*a* and 128*b* using photolithography. The opening 203 may be in the position where the laser drilling is to eventually be performed. In some embodiments, the PID layer 124, where the laser is to be drilled, can be opened in FIG. 2A, for example, to minimize an amount of material that may be splashed up by the laser. In some other embodiments, the step illustrated in FIG. 2A may be optional and may be skipped, and the opening 203 may be formed using laser drilling.

Figure 2B:
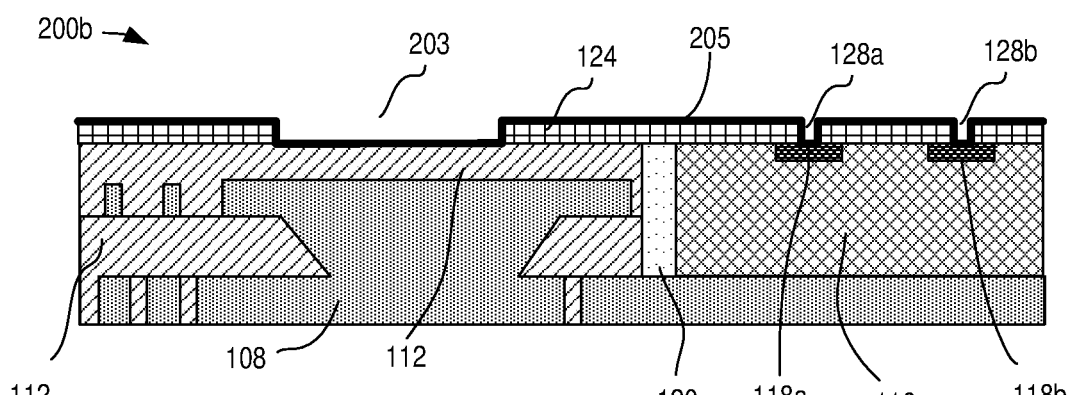

Referring now to FIG. 2B, illustrated is a component 200*b* in which a protection layer 205 (illustrated using a thick line) is applied on the top surface of the component 200*a*. In some embodiments, the protection layer 205 may comprise sputter seed. In some embodiments, the sputter seed may comprise copper, copper-titanium alloy, another appropriate coper alloy, and/or the like. In some other embodiments, the protection layer 205 may comprise electroless copper layer (e.g., copper layer deposited using an electroless plating process).

In some embodiments, sputter seed may be less porous than electroless copper, and hence, sputter seed may be used for the protection layer 205 if, for example, a wet desmear is to be used later. In some other embodiments, electroless copper may protect the surface from a dry desmear such as Fluorine and Oxygen plasma, and hence, electroless copper may be used for the protection layer 205 in such scenarios.

Figure 2C:
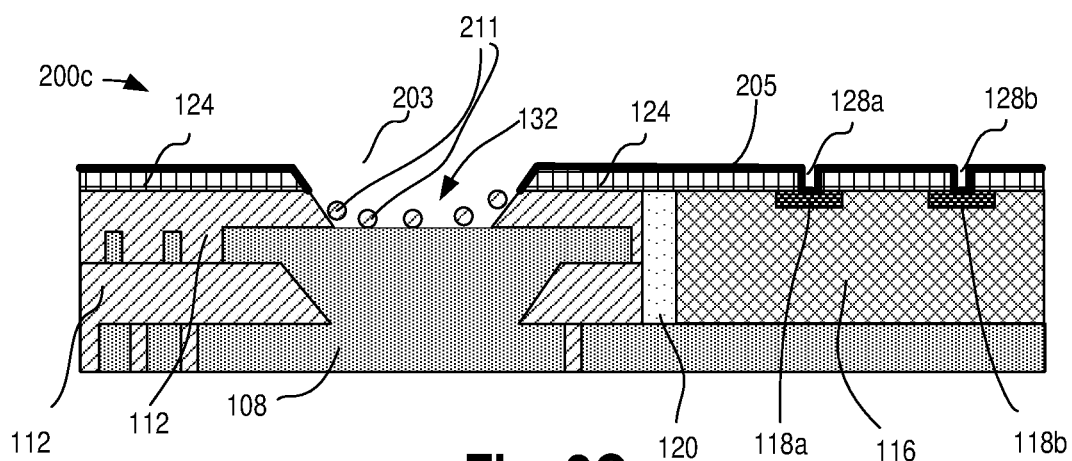

Referring now to FIG. 2C, illustrated is a component 200*c* in which a via or an opening 132 drilled using laser. For laser drilling, in an example, an alignment is performed using edge detection of a lithographically opened fiducial. In another example, the fiducial can be laser skived if alignment to a previous layer is desired. Also illustrated in FIG. 2C are residues 211 of the layer 112, the PID layer 124, and/or the protection layer 205. The residues 211, for example, may reside at a bottom section of the opening 132.

Figure 2D:
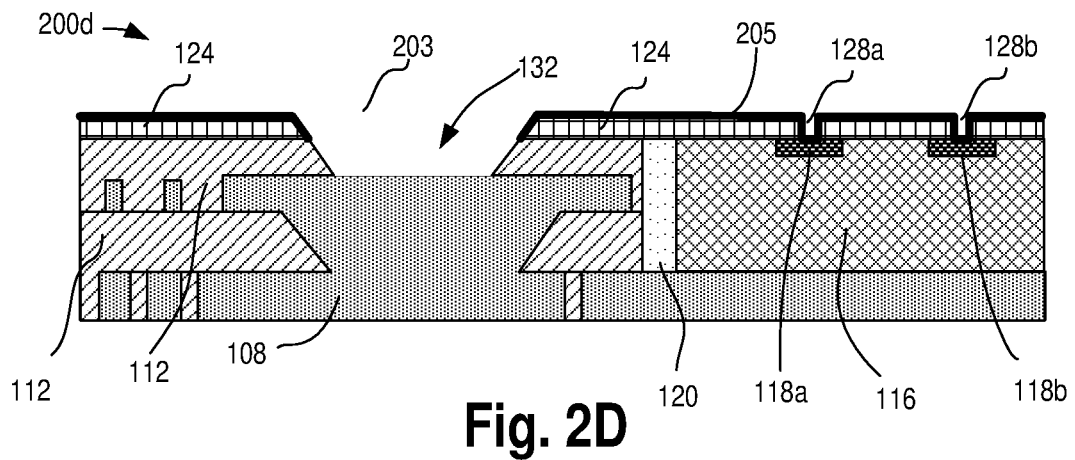

Referring now to FIG. 2D, illustrated is a component 200*d* in which the residues 211 of the component 200*c* are removed by an appropriate desmear process (e.g., using a desmear bath, using an appropriate wet desmear, using an appropriate dry desmear such as Fluorine and/or Oxygen plasma, and/or the like). Because the PID 124 layer is coved by the protection layer 205, the PID 124 layer may be protected from the desmear process.

Figure 2E:
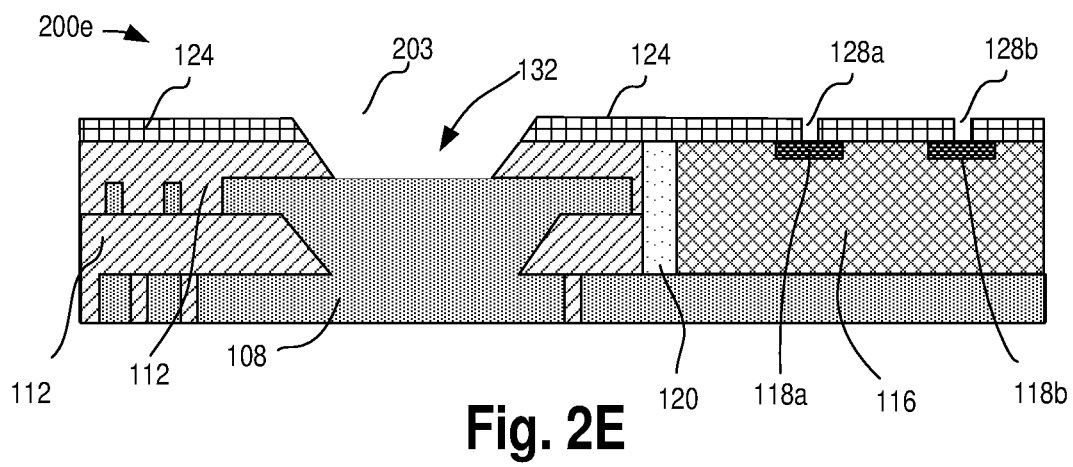

Referring now to FIG. 2E, illustrated is a component 200e in which the protection layer 205 of the component 200d may be removed. The removal of the protection layer 205 may be performed, for example, by chemical etching, e.g., by a flash etch process. Etching the protection layer 205 may, for example, ensure a relatively pristine surface free of copper splash and laser drilling residue. The component 200e of FIG. 2E may be similar to the component 100i of FIG. 1I, and the process of formation of the interconnect structures 150, 154a, and 154b may then continue, as discussed with respect to FIGS. 1J-1M.

Although not illustrated in the figures, the protection layer 205 may also be applied to and removed from the sides and bottom surfaces of the components illustrated in at least some of FIGS. 2A-2E. Thus, the sides and bottom surfaces of the component 200e may comprise relatively pristine surface free of copper splash and laser drilling residue. In an example, having the surfaces (e.g., top, bottom, sides) of the component 200e pristine, e.g., free of copper splash and laser drilling residue, may ensure about symmetrical surface finish of all the surfaces of the component 200e, which may help in reducing substrate warpage.

Referring again to FIGS. 1E and 1F, in these figures, a layer 120 is deposited in the trench or cavity 114a and also on the top of the surface of the component 100e. Subsequently, the portion of the layer 120 deposited on the top of the surface of the component 100e is etched, without removing the section of the layer 120 in the trench or cavity 114a. For example, the etching of the layer 120 has to stop precisely before the material from the trench or cavity 114a is being etched.

Figure 3A:
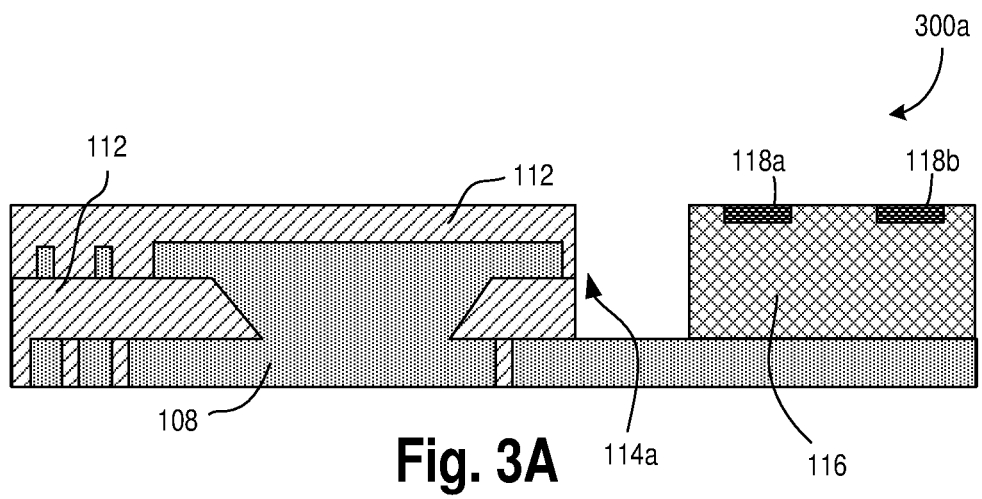
FIGS. 3A-3C illustrate operations associated with forming a layer, and selectively etching the layer such that the layer is not etched from a cavity, according to some embodiments.
Figure 3B:
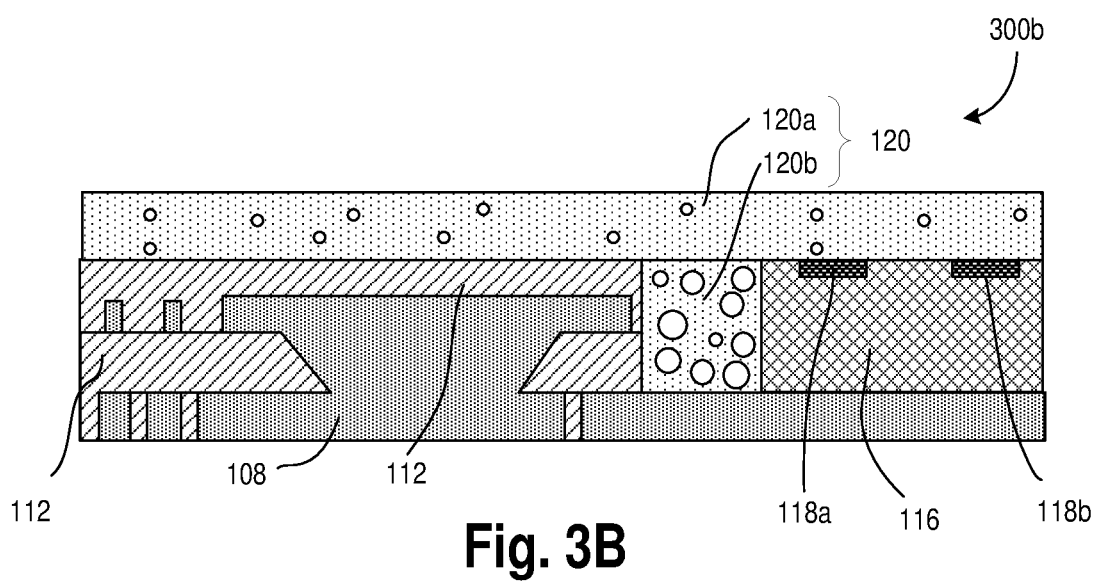
Figure 3C:
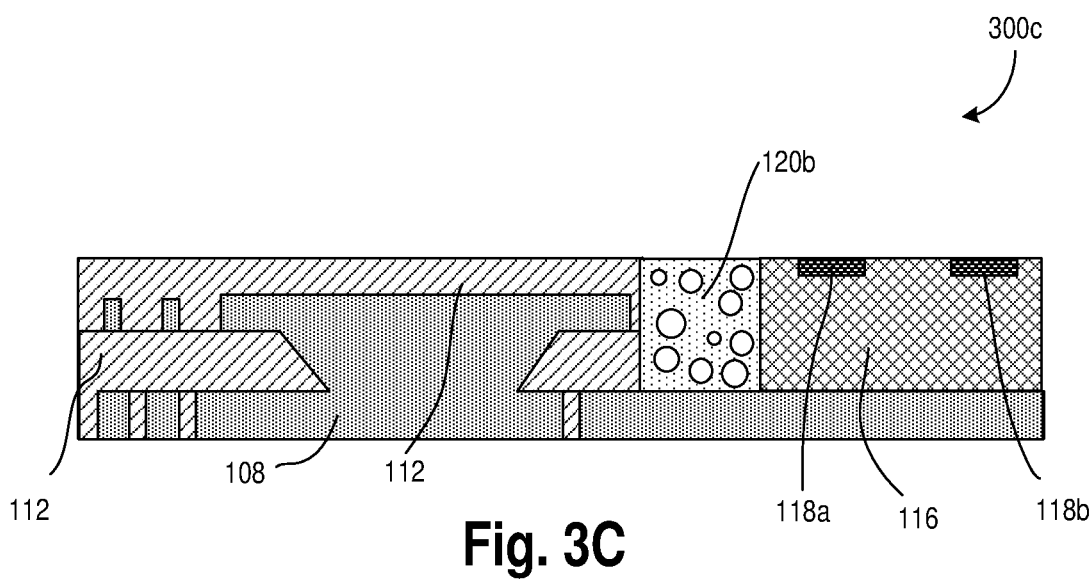

FIGS. 3A-3C illustrate operations associated with forming the layer 120, and selectively etching the layer 120 such that the layer 120 is not etched from the trench or cavity 114a, according to some embodiments. Referring to FIG. 3A, illustrated is a component 300a, which is similar to the component 100d of FIG. 1D. Also, in FIG. 3A, the cavity 114a is illustrated to have a larger size compared to the trench or cavity 114a in FIG. 1D. However, such a difference is merely to illustrate the trench or cavity in greater details (which facilitates discussion for subsequent FIGS. 3B-3C), and may not signify an actual difference in size of the trench or cavity 114a in FIGS. 1D and 3A.

Referring now to FIG. 3B, the layer 120 is deposited on the component 300a to form a component 300b. In some embodiments, the layer 120 comprises two layers, e.g., layers 120a and 120b. For example, the material deposited in the trench or cavity 114a may be different from the material deposited on a top surface of the component 300a.

In some embodiments, the material used for filing the trench or cavity 114a (e.g., the layer 120b) may have relatively high filler density, may include large filler materials, may have low etch rate, and/or may be difficult to be removed. In contrast, the material deposited on the top surface of the component 300b (e.g., the layer 120a) may have relatively low filler density, may include small filler materials, may have high etch rate, and/or may be easy to be removed. For example, in FIG. 3B, filler materials are illustrated as circles within the layers 120a and 120b (although the circles are for illustrative purposes only, and do not represent the actual shape, size, and/or number of filler materials in these layers). For example, the filler materials in the layer 120a have lower density and/or smaller in size, e.g., compared to those in the layer 120b. For example, the material in the layer 120a may have less than 50% nano-filler loading, whereas the layer 120b may have more than 70% micro-filler loading.

Referring now to FIG. 3C, the layer 120a may be etched, and the layer 120b may substantially remain in a component 300c. The component 300c of FIG. 3C is similar to the component 100f of FIG. 1F, and the process for formation of interconnect structures 150 and 154a, 154b continues from FIG. 1F.

Referring again to FIGS. 3B-3C, in some embodiments, such a bilayer or graded material in the layer 120 may effectively provide a built in etch stop layer, and reduce a dishing that may occur in the trench or cavity 114, if, for example, a standard, uniform dielectric is used for the layer 120. Thus, during the etch process of FIG. 3C, the layer 120a may be etched, but the layer 120b may not be etched.

Although two distinct and separate layers 120a and 120b are illustrated in FIG. 3B, in some embodiments, there may not be a distinct boundary between these two layers. For example, graded material may be used to form these two layers. In some embodiments, the deposition of the material for the layers 120a and 120b may be performed in any appropriate manner, e.g., by lamination, molding, slit-coating, etc. For example, the dielectric material for the layers 120a and 120b may be compression molded, vacuum laminated, and/or slit coated.

In some embodiments, for compression molded dielectric film formation, film, granular and/or liquid epoxy mold compounds may be used to form the dielectric layer. In an example, when films are used, bi-layer films with graded coefficients of thermal expansions (CTEs) may be compression molded. In some embodiments, desired CTEs may be achieved by modifying the mold formulation of each layer. Merely as an example, the mold formulation of each layer may be achieved by varying the filler content. Films that can be used may include, but not limited to, solvent type or non-solvent type mold films from Nagase ChemteX Corporation™. A range of CTEs in these films may be achieved by varying the filler content. In some other embodiments, different types of fillers can also be used to get varying CTE.

In some embodiments, granular or liquid epoxy mold materials may also be compression molded to form the dielectric layer 120. The mold formulations in such a scenario may have long chained polymers, e.g., which upon mold cure may phase separate or precipitate to form a resin rich surface layer that can be planarized or etched subsequently. In these type of mold materials, CTE of the layers may be chosen to be as close as possible to the component 116.

In some embodiments, vacuum lamination may also be used to form the layers 120a and 120b. For example, vacuum lamination may be used for buildup dielectric application to a panel in a substrate manufacturing process. Incoming material for vacuum lamination process may be a monolithic film formed by varnish coating on a polyester (e.g., polyethylene terephthalate (PET)) base film. However, multilayer materials may have precedence for enabling SAP process on difficult material. For example, coating a thin primer material on top of another material may overcome copper adhesion marginality to the buildup dielectric, aiding in enabling fine line and space patterning. Assuming similar viscosities between the layers 120a and 120b, vacuum lamination may be employed to apply the material to the panel during a substrate manufacturing process.

In some embodiments, alternatively (e.g., assuming that the viscosity requirements are difficult to manage from a lamination process window) may be to use dielectric material varnish instead, and coat the layers 120b and 120a sequentially. In an example, by avoiding reheating the material to enable flow in lamination, the viscosity of the varnish may be further optimized to enable pattern filling with various sizes of filler materials. This may be achieved through solvent content of the varnish, filler distribution size optimization, as well as filler surface treatment. Through sequential coating and drying steps, a gradient of filler sizes and etch rate can be deposited to form the layers 120a and 120b.

Although FIGS. 3A-3C illustrate filing a cavity and a top surface of the component 300b using the layers 120b and 120a, respectively, and selectively etching the layer 120a (e.g., without substantially etching the layer 120b, or merely etching layer 120a), the teaching of this disclosure may be applied to fill any cavity of any other component as well.

Figure 4:
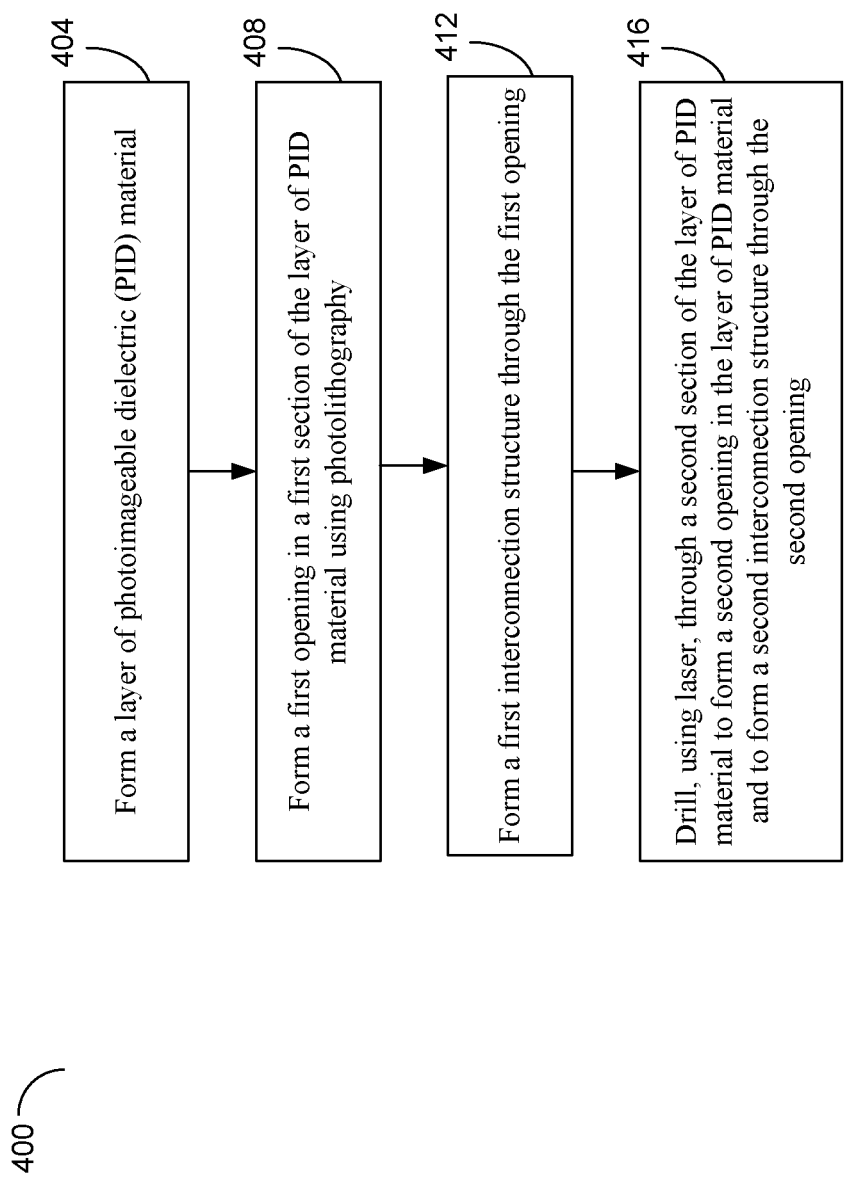
FIG. 4 illustrates a flowchart depicting a method for forming a first interconnect structure using photoimageable dielectric (PID) and lithography, and a second interconnect structure using laser drilling, according to some embodiments.

FIG. 4 illustrates a flowchart depicting a method 400 for forming a first interconnect structure using photoimageable dielectric (PID) and lithography, and a second interconnect structure using laser drilling, according to some embodiments. Although the blocks in the flowchart with reference to FIG. 4 are shown in a particular order, the order of the actions can be modified. Thus, the illustrated embodiments can be performed in a different order, and some actions/blocks may be performed in parallel. Some of the blocks and/or operations listed in FIG. 4 are optional in accordance with certain embodiments. The numbering of the blocks presented is for the sake of clarity and is not intended to prescribe an order of operations in which the various blocks must occur.

Figure 5:
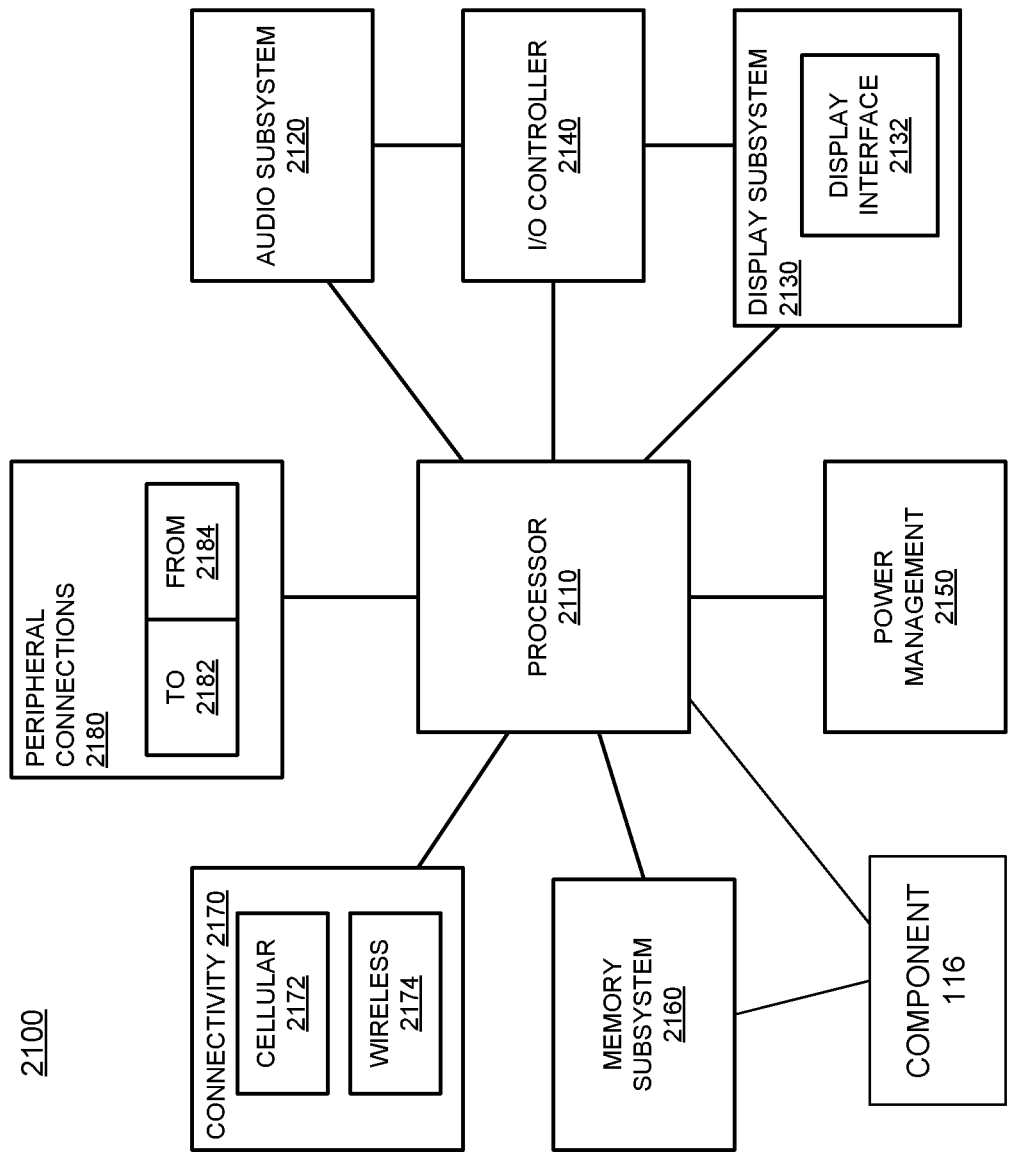
FIG. 5 illustrates a computer system or a SoC (System-on-Chip), where a first interconnect structure is formed using PID material and lithography, and a second interconnect structure is formed using laser drilling, according to some embodiments.

At 404, a layer of PID material (e.g., PID layer 124) is formed. At 408, a first opening in a first section of the layer of PID material (e.g., opening 128a) is formed using photolithography. At 412, a first interconnection structure (e.g., interconnection structure 154) through the first opening is formed. At 416, a second section of the layer of PID material is drilled using laser, for example, to form a second opening (e.g., opening 132) in the layer of PID material and to form a second interconnection structure (e.g., interconnection structure 150) through the second opening FIG. 5 illustrates a computer system or a SoC (System-on-Chip) 2100, where a first interconnect structure is formed using PID material and lithography, and a second interconnect structure is formed using laser drilling, according to some embodiments. It is pointed out that those elements of FIG. 5 having the same reference numbers (or names) as the elements of any other figure can operate or function in any manner similar to that described, but are not limited to such.

In some embodiments, computing device 2100 represents an appropriate computing device, such as a computing tablet, a mobile phone or smart-phone, a laptop, a desktop, an IOT device, a server, a set-top box, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 comprises the component 116 of FIGS. 1A-3C. The component 116, for example, electrically connects two dies of the computing device 2100. Merely as an example, FIG. 5 illustrates the component 116 electrically connecting a processor die (e.g., of the processor 2110) and a memory die of the memory subsystem 2160. In some embodiments, one or more interconnection structures between the component 116 and another die may be formed lithographically using PID material, e.g., as discussed with respect to FIGS. 1A-4. In some embodiments, one or more interconnection structures that are adjacent to the component 116 may be formed by laser drilling, e.g., as discussed with respect to FIGS. 1A-4.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Clause 1. An apparatus comprising: a photoimageable dielectric layer; a first interconnect structure formed through the photoimageable dielectric such that a first opening in the photoimageable dielectric for the first interconnect structure has a first width; and a second interconnect structure formed through the photoimageable dielectric such that a second opening in the photoimageable dielectric for the second interconnect structure has a second width, wherein the second width is substantially larger than the first width.

Clause 2. The apparatus clause 1, wherein: the first width is in a range of about 3-20 micrometers ($\mu$m); and the second width is in a range of about 30-60 $\mu$m.

Clause 3. The apparatus of any of clauses 1-2, wherein: the first interconnect structure is formed over a die; and the second interconnect structure is formed on a surface adjacent to the die, the surface being separated from the die by a cavity.

Clause 4. The apparatus of clause 3, wherein the cavity is filed with graded dielectric material.

Clause 5. The apparatus of any of clauses 3-4, wherein the die is a bridge die that comprises passive components and routing structures, and does not comprise active components.

Clause 6. The apparatus of any of clauses 3-5, wherein the die is an Embedded Multi-die Interconnect Bridge (EMIB) that is to interconnect a first active die and a second active die.

Clause 7. The apparatus of any of clauses 1-6, wherein: the first interconnect structure is formed at least in part using a lithography process; and the second interconnect structure is formed at least in part using a laser drilling process.

Clause 8. A method comprising: forming a layer of photoimageable dielectric (PID) material; forming a first opening in a first section of the layer of PID material using photolithography; forming a first interconnection structure through the first opening; and drilling through a second section of the layer of PID material to form a second opening in the layer of PID material and to form a second interconnection structure through the second opening.

Clause 9. The method of clause 8, further comprising: forming a protection layer on the layer of PID material and the first opening, prior to the drilling; and desmearing the second opening to clean residues generated by the drilling, wherein the protection layer protects the layer of PID material and the first opening from etching during desmearing of the second opening.

Clause 10. The method of clause 9, further comprising: etching the protection layer, subsequent to desmearing the second opening to clean the residues.

Clause 11. The method of any of clauses 8-10, wherein: the first opening has a first width; and the second opening has a second width that is substantially larger than the first opening.

Clause 12. The method of any of clauses 8-11, wherein drilling through the second section of the layer of PID material comprises: drilling, using laser, through the second section of the layer of PID material.

Clause 13. The method of any of clauses 8-12, wherein the first interconnect structure is formed over a bump pad of a bridge die and the second interconnect structure is formed through a dielectric layer, and wherein the method further comprises: forming a cavity between the bridge die and the dielectric layer; forming a first layer using first material and second material, wherein the first material is deposited within the cavity, wherein the second material is deposited on top of the bridge die and the dielectric layer, and wherein the first material is different from the second material; and etching the second material such that substantially the entire first material remains within the cavity.

Clause 14. The method of clause 13, wherein: the first material has high filler density and low etch rate compared to the second material.

Clause 15. A system comprising: a first semiconductor die; a second semiconductor die; a bridge die to electrically couple the first semiconductor die and the second semiconductor die; a first interconnect structure formed between the first semiconductor die and the bridge die, the first interconnect structure having a first width; and a second interconnect structure formed between the first semiconductor die and a conductive area, the conductive area formed at a side of the bridge die, the second interconnect structure having a second width different than the first width.

Clause 16. The system of clause 15, further comprising: a photoimageable dielectric (PID) layer formed on the bridge die and the conductive area, wherein the first interconnect structure is formed through a first opening in the PID layer and the second interconnect structure is formed through a second opening in the PID layer.

Clause 17. The system of clause 16, wherein the first opening has a width of about 3-20 micrometers and the second opening has a width of more than about 40 micrometers.

Clause 18. The system of any of clauses 15-17, wherein: the first interconnect structure is formed on a bump pad of the bridge die.

Clause 19. The system of any of clauses 15-18, wherein the bridge die is an Embedded Multi-die Interconnect Bridge (EMIB).

Clause 20. A method comprising: forming a cavity between a first component and a second component; forming a dielectric layer within the cavity and on top of the first and second components; and etching a first section of the dielectric layer disposed on top of the first and second components, without etching a second section of the dielectric layer disposed within the cavity, wherein the first section of the dielectric layer has low filler density and high etch rate compared to the second section of the dielectric layer.

Clause 21. The method of clause 20, wherein the dielectric layer comprises a bilayer or graded dielectric material.

Clause 22. The method of any of clauses 20-21, wherein: while etching the first section of the dielectric layer disposed on top of the first and second components, the second section of the dielectric layer acts as an etch stop layer.

Clause 23. The method of any of clauses 20-22, wherein: the first section of the dielectric layer has a first coefficient of thermal expansion that is different from a second coefficient of thermal expansion of the second section of the dielectric layer.

Clause 24. The method of any of clauses 20-23, wherein forming the dielectric layer comprises: molding the dielectric layer within the cavity and on top of the first and second components.

Clause 25. The method of any of clauses 20-23, wherein forming the dielectric layer comprises: laminating the dielectric layer, using a vacuum lamination process, within the cavity and on top of the first and second components.

Clause 26. The method of any of clauses 20-23, wherein forming the dielectric layer comprises: applying a first coat of first dielectric material within the cavity to form the second section of the dielectric layer; and applying a second coat of second dielectric material on top of the first and second components to form the first section of the dielectric layer.

Clause 27. An apparatus comprising: means for forming a layer of photoimageable dielectric (PID) material; means for forming a first opening in a first section of the layer of PID material using photolithography; means for forming a first interconnection structure through the first opening; and means for drilling through a second section of the layer of PID material to form a second opening in the layer of PID material and to form a second interconnection structure through the second opening.

Clause 28. The apparatus of clause 27, further comprising: means for forming a protection layer on the layer of PID material and the first opening, prior to the drilling; and means for desmearing the second opening to clean residues generated by the drilling, wherein the protection layer protects the layer of PID material and the first opening from etching during desmearing of the second opening.

Clause 29. The method of clause 28, further comprising: means for etching the protection layer, subsequent to desmearing the second opening to clean the residues.

Clause 30. The method of any of clauses 27-29, wherein: the first opening has a first width; and the second opening has a second width that is substantially larger than the first opening.

Clause 31. The apparatus of any of clauses 27-30, wherein the means for drilling through the second section of the layer of PID material comprises: means for drilling, using laser, through the second section of the layer of PID material.

Clause 32. The apparatus of any of clauses 27-31, wherein the first interconnect structure is formed over a bump pad of a bridge die and the second interconnect structure is formed through a dielectric layer, and wherein the apparatus further comprises: means for forming a cavity between the bridge die and the dielectric layer; means for forming a first layer using first material and second material, wherein the first material is deposited within the cavity, wherein the second material is deposited on top of the bridge die and the dielectric layer, and wherein the first material is different from the second material; and means for etching the second material such that substantially the entire first material remains within the cavity.

Clause 33. The apparatus of clause 32, wherein: the first material has high filler density and low etch rate compared to the second material.

Clause 34. An apparatus comprising: means for forming a cavity between a first component and a second component; means for forming a dielectric layer within the cavity and on top of the first and second components; and means for etching a first section of the dielectric layer disposed on top of the first and second components, without etching a second section of the dielectric layer disposed within the cavity, wherein the first section of the dielectric layer has low filler density and high etch rate compared to the second section of the dielectric layer.

Clause 35. The apparatus of clause 34, wherein the dielectric layer comprises a bilayer or graded dielectric material.

Clause 36. The apparatus of any of clauses 34-35, wherein: while etching the first section of the dielectric layer disposed on top of the first and second components, the second section of the dielectric layer acts as an etch stop layer.

Clause 37. The apparatus of any of clauses 34-36, wherein: the first section of the dielectric layer has a first coefficient of thermal expansion that is different from a second coefficient of thermal expansion of the second section of the dielectric layer.

Clause 38. The apparatus of any of clauses 34-37, wherein the means for forming the dielectric layer comprises: means for molding the dielectric layer within the cavity and on top of the first and second components.

Clause 39. The apparatus of any of clauses 34-37, wherein the means for forming the dielectric layer comprises: means for laminating the dielectric layer, using a vacuum lamination process, within the cavity and on top of the first and second components.

Clause 40. The apparatus of any of clauses 34-37, wherein the means for forming the dielectric layer comprises: means for applying a first coat of first dielectric material within the cavity to form the second section of the dielectric layer; and means for applying a second coat of second dielectric material on top of the first and second components to form the first section of the dielectric layer.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:
    forming a layer of photoimageable dielectric (PID) material;
    forming a first opening in a first region of the layer of PID material using photolithography;
    forming a second opening by drilling through at least a non-photodefinable material below a second region of the layer of PID material;
    forming a first interconnection structure through the first opening and forming a second interconnection structure through the second opening by plating a metal concurrently into the first and second openings.

2. The method of claim 1, further comprising:
    forming a protection layer over the layer of PID material and into the first opening, prior to the drilling; and
    desmearing the second opening to clean residues generated by the drilling,
    wherein the protection layer protects the layer of PID material and the first opening from etching during desmearing of the second opening.

3. The method of claim 2, further comprising:
    removing the protection layer from the first opening, subsequent to the desmearing.

4. The method of claim 1, wherein:
    the first opening has a first width; and
    the second opening has a second width that is substantially larger than the first width.

5. The method of claim 1, wherein the drilling comprises:
    drilling, using a laser, through the non-photodefinable dielectric material.

6. The method of claim 5, wherein the first interconnection structure is over a bump pad of a bridge die and the second interconnection structure is through the non-photodefinable dielectric material, and wherein the method further comprises:
    forming a cavity between the bridge die and the non-photodefinable dielectric layer; and
    forming a third dielectric material within the cavity.

7. The method of claim 1, wherein:
    the photolithography also forms the second opening through the second region of the layer of PID material;

a protection layer is deposited into the second opening and over a non-photodefinable dielectric material underlying the second region of the PID material; and the drilling forms the second opening through the protection layer and through the non-photodefinable dielectric material to expose an underlying interconnection feature.

8. The method of claim 1, wherein forming the first and second interconnection structures comprises plating Cu concurrently into the first and second openings.

9. The method of claim 1, wherein forming the second opening comprises drilling through the second region of the PID material.

10. The method of claim 1, wherein:
the first opening exposes a metallization feature under, and in contact with, the PID material; and
the protection layer contacts the metallization feature.

11. The method of claim 2, wherein the protection layer comprises Cu.

12. The method of claim 2, wherein the desmear comprises permanganate.

13. A method comprising:
forming a cavity between a first component and a second component;
forming a dielectric material within the cavity and on top of the first and second components; and
etching a first section of the dielectric material on top of the first and second components, without etching a second section of the dielectric material within the cavity,
wherein the first section of the dielectric material has low filler density and high etch rate compared to the second section of the dielectric material.

14. The method of claim 13, wherein:
the dielectric material comprises a bilayer or graded dielectric material; and
while etching the first section of the dielectric material on top of the first and second components, the second section of the dielectric material acts as an etch stop layer.

15. The method of claim 13, wherein:
the first section of the dielectric material has a first coefficient of thermal expansion that is different from a second coefficient of thermal expansion of the second section of the dielectric material.

16. A method comprising:
forming a layer of photoimageable dielectric (PID) material;
forming a first opening in a first region of the layer of PID material using photolithography;
forming a protection layer over the layer of PID material and into the first opening;
forming a second opening by drilling through at least a non-photodefinable material below a second region of the layer of PID material;
forming a first interconnection structure through the first opening after removing the protection layer from the first opening; and
forming a second interconnection structure through the second opening.

17. The method of claim 16, wherein:
the photolithography also forms the second opening through the second region of the layer of PID material;
the protection layer is deposited into the second opening and over the non-photodefinable dielectric material underlying the second region of the PID material; and
the drilling forms the second opening through the protection layer and through the non-photodefinable dielectric material to expose an underlying interconnection feature.

18. The method of claim 16, wherein forming the first and second interconnection structures comprises plating Cu concurrently into the first and second openings.

19. The method of claim 16, wherein the protection layer comprises Cu.

20. The method of claim 16, wherein forming the second opening comprises drilling through the second region of the PID material.

* * * * *